(12) United States Patent
Vo et al.

(10) Patent No.: US 7,586,787 B2
(45) Date of Patent: Sep. 8, 2009

(54) REDUCING BIT LINE LEAKAGE CURRENT IN NON-VOLATILE MEMORIES

(75) Inventors: Chinh Vo, San Jose, CA (US); Harry Shengwen Luan, Saratoga, CA (US); Pearl Cheng, Los Altos, CA (US)

(73) Assignee: Kilopass Technology Inc., Santa Clara, CA (US)

( * ) Notice: Subject to any disclaimer, the term of this patent is extended or adjusted under 35 U.S.C. 154(b) by 67 days.

(21) Appl. No.: 11/858,515

(22) Filed: Sep. 20, 2007

(65) Prior Publication Data

US 2009/0080275 A1 Mar. 26, 2009

(51) Int. Cl.
*G11C 16/04* (2006.01)

(52) U.S. Cl. .............................. 365/185.18; 365/185.23; 365/185.27

(58) Field of Classification Search ............ 365/185.18, 365/185.21, 185.23, 185.27
See application file for complete search history.

(56) References Cited

U.S. PATENT DOCUMENTS

| | | | | |
|---|---|---|---|---|
| 5,818,757 A * | 10/1998 | So et al. ................. | 365/185.18 |
| 6,058,060 A * | 5/2000 | Wong ......................... | 365/218 |
| 6,181,599 B1* | 1/2001 | Gongwer ............... | 365/185.18 |
| 6,285,593 B1* | 9/2001 | Wong .................... | 365/185.23 |
| 6,535,430 B2* | 3/2003 | Ogura et al. ........... | 365/185.23 |
| 6,611,460 B2* | 8/2003 | Lee et al. ............... | 365/185.18 |
| 7,042,767 B2* | 5/2006 | Wang et al. ............. | 365/185.28 |
| 7,269,080 B2* | 9/2007 | Bedeschi et al. ........ | 365/189.09 |
| 7,391,654 B2* | 6/2008 | Aritome ................. | 365/185.29 |
| 7,397,721 B2* | 7/2008 | Lee ............................ | 365/227 |
| 7,463,525 B2* | 12/2008 | Zheng et al. ........... | 365/185.21 |
| 2008/0247254 A1* | 10/2008 | Nguyen et al. .............. | 365/212 |

\* cited by examiner

*Primary Examiner*—Tuan T Nguyen
*Assistant Examiner*—Hien N Nguyen
(74) *Attorney, Agent, or Firm*—Schwegman, Lundberg & Woessner, P.A.

(57) ABSTRACT

In example embodiments, methods are provided for reducing bit line leakage current. In an example embodiment, an unselected program word line is biased to a bias voltage. The unselected program word line is connected to a memory cell and the memory cell includes a plurality of transistors. In another example embodiment, an unselected memory cell is biased to a negative bias voltage during read operations.

20 Claims, 9 Drawing Sheets

US 7,586,787 B2

REDUCING BIT LINE LEAKAGE CURRENT IN NON-VOLATILE MEMORIES

FIELD

The present disclosure relates generally to non-volatile memories. In an example embodiment, the disclosure relates to reduction of bit line leakage current.

BACKGROUND

Non-volatile memory retains stored data when power is removed, which is desirable in many different types of electronic devices. In non-volatile memory, a memory cell may be weakly programmed while another memory cell connected to the same bit line may be strongly programmed. In read operations or sensing modes, current from a bit line may leak through the unselected, strongly programmed memory cells sharing the same selected bit line. Leakage of bit line current may be less than 1 uA or may be about 3 uA. The bit line leakage current can adversely affect the sensing speed in read operations, especially for memory with long bit lines or for reading bits with low cell current.

BRIEF DESCRIPTION OF DRAWINGS

The present disclosure is illustrated by way of example and not limitation in the figures of the accompanying drawings, in which like references indicate similar elements and in which.

DESCRIPTION OF EXAMPLE EMBODIMENTS

In the following description, for purposes of explanation, numerous specific details are set forth in order to provide a thorough understanding of an example embodiment of the present disclosure. It will be evident, however, to one skilled in the art that the present disclosure may be practiced without these specific details.

Overview

Methods and circuitries for reducing bit line leakage current in memory are provided. In an example embodiment, bit line leakage current may be reduced by biasing an unselected program word line to a bias voltage. As explained in more detail below, the unselected program word line may be biased during a read operation or during a discharge period of the selected bit line. Alternatively, the unselected program word line may be biased at all times. In another example embodiment, bit line leakage current may be reduced by biasing an unselected memory cell to a negative bias voltage during a read operation.

Example Embodiments

Figure 1:
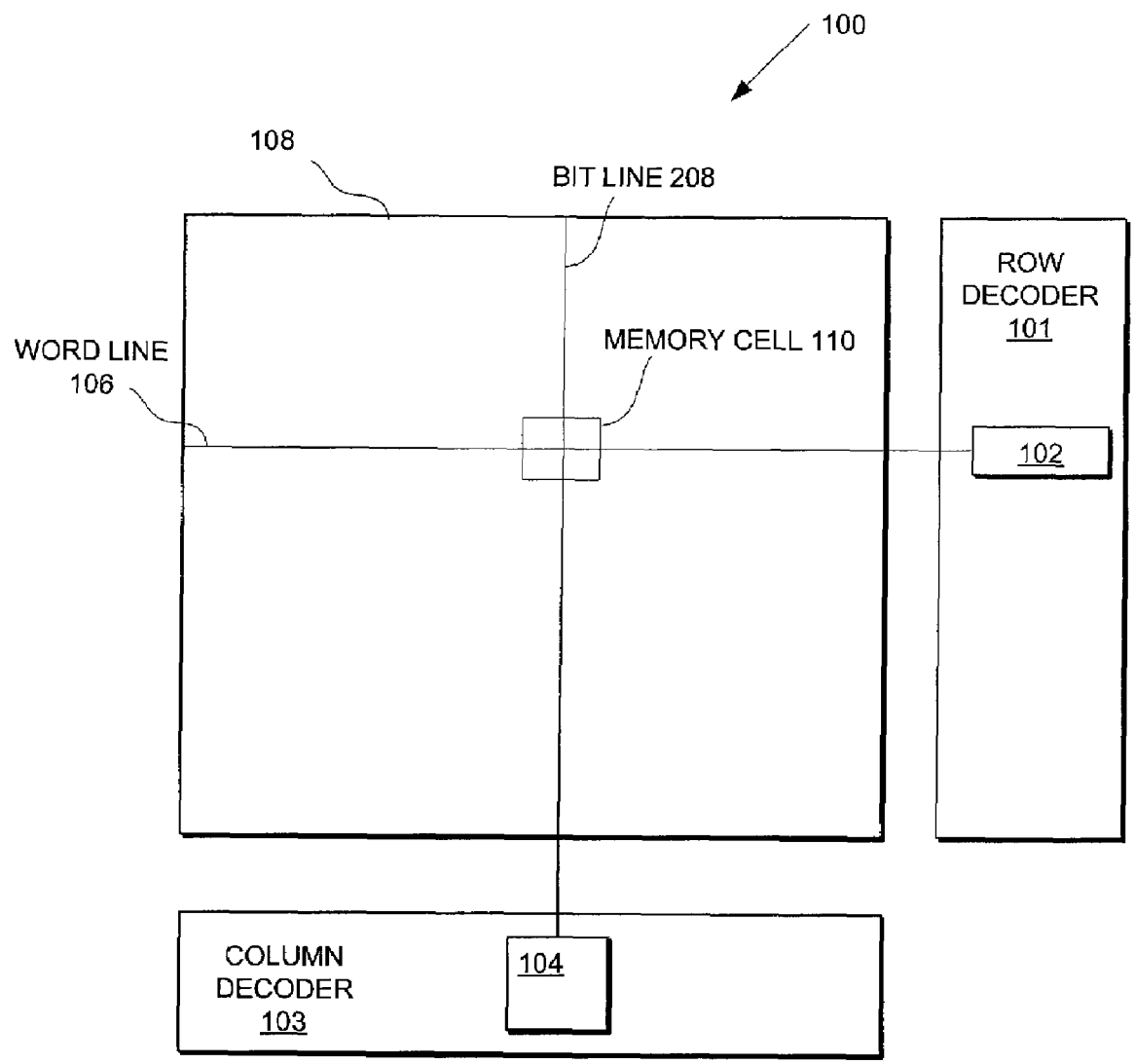
FIG. 1 is a simplified block diagram of a memory, in accordance with an example embodiment.

FIG. 1 is a simplified block diagram of a memory, in accordance with an example embodiment. Memory 100 may, for example, include a non-volatile memory. Generally, memory 100 includes memory array 108, row decoder 101, and column decoder 103. Memory array 108 comprises memory cells, such as memory cell 110, in which bits are stored. Memory cell 110 includes one or more transistors that are capable of storing one or more bits. Memory cell 110 is connected to one or more word lines, such as word line 106, and one or more bit lines, such as bit line 208.

Memory cell 110 may be selected for reading, programming, verifying, or erasing by activating word line 106 and bit line 208 connected to the memory cell. Row decoder 101 may include multiple logic circuits, such as logic circuit 102 associated with memory cell 110, that is configured to select word line 106 based on a row address. As explained in more detail below, in an example embodiment, row decoder 101 may be configured to bias an unselected program word line to reduce bit line 208 leakage current. In another example embodiment, as explained in more detail below, memory cell 110 may be biased to a negative bias voltage. It should be appreciated that biasing is the application of a steady voltage or current. Column decoder 103 also may include multiple logic circuits, such as logic circuit 104, that is configured to select bit line 208 based on a column address. The read-out signal provided by column decoder 103 is transferred to sense amplifiers (not shown), which sense the memory state of memory cell 110.

Figure 2:
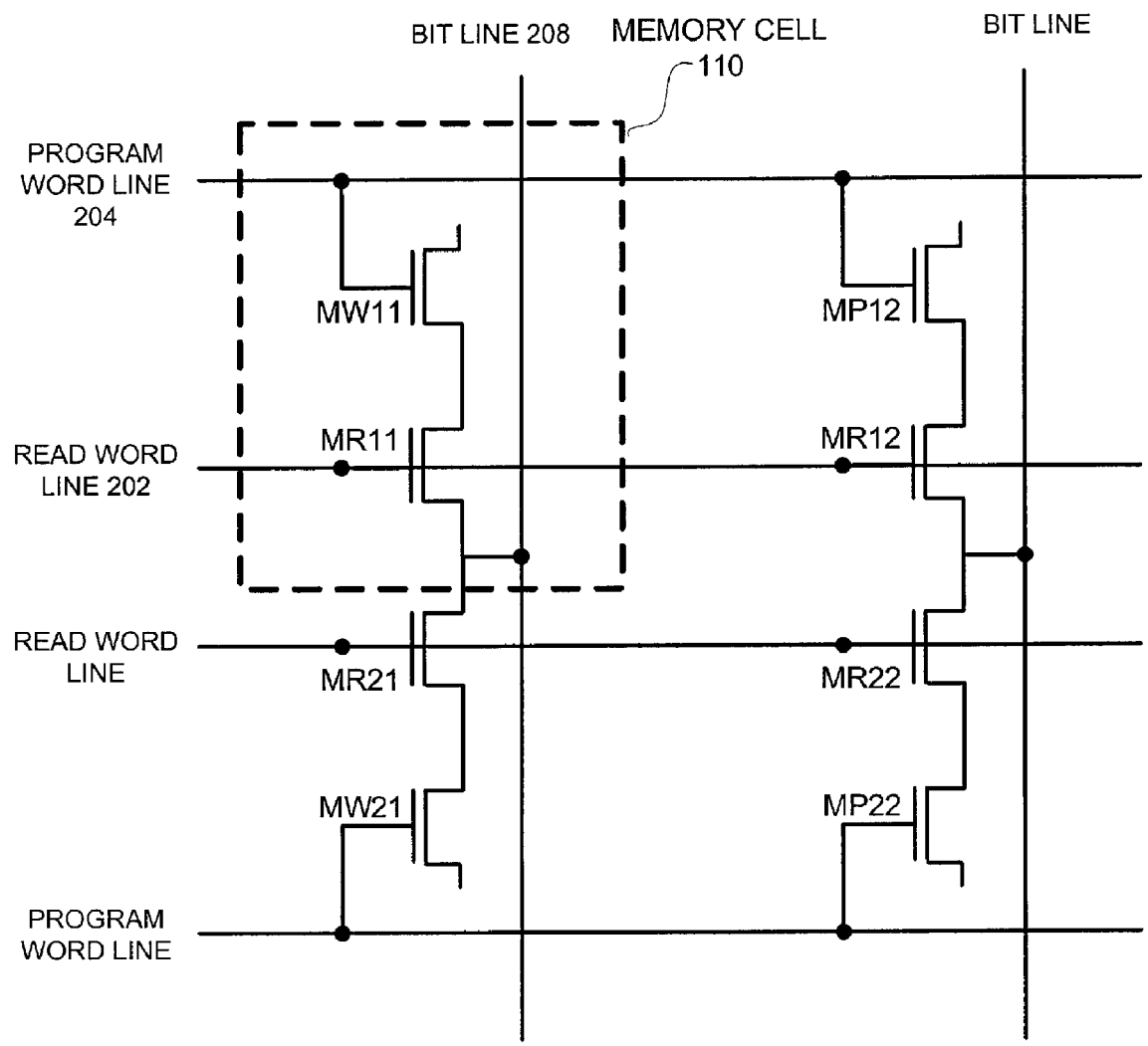
FIG. 2 is a schematic diagram of a memory cell, in accordance with an example embodiment.

FIG. 2 is a schematic diagram of a memory array, in accordance with an example embodiment. The example of 2×2 memory array includes four memory cells. A memory cell 110 may include read word line 202 and program word line 204. Additionally, memory cell 110 may include bit line 208. Memory cell 110 may include breakdown transistor MW11 and select transistor MR11. It should be appreciated that breakdown transistor MW11 is a half transistor that is programmed by breakdown on the gate oxide. The half transistor may be replaced with a Metal Oxide Semiconductor (MOS) capacitor (or a polysilicon-oxide-semiconductor capacitor) or a full transistor with a floating source. Thus, the term "breakdown transistor" as used herein refers to a device that is programmed using breakdown of a gate oxide.

As shown in FIG. 2, select transistor MR11 is connected in series with breakdown transistor MW11. Breakdown transistor MW11 has its gate connected to program word line 204. The gate of select transistor MR11 is connected to read word line 202. Furthermore, the source of select transistor MR11 is connected to bit line 208, which is shared with other memory cells in the same column.

To program memory cell 110, bit line 208 is set to low. A programming pulse (high voltage programming pulse (VPP)) is applied to program word line 204 after select transistor MR11 is turned on by biasing read word line 202 to, for example, VPP/2. This can result in a breakdown of the gate oxide of breakdown transistor MW11, thus forming a conducting path. The programming may be controlled also by the amplitude and width of the VPP programming pulse. Further, the amount of programming current through breakdown transistor MW11 may be controlled by a current driver transistor (not shown) on bit line 208.

To read from memory cell 110, bit line 208 is precharged to a voltage close to zero volts. Program word line 204 is at logic signal or read voltage (vrd) and, during the read, read word line 202 is biased to power supply voltage (vdd).

Figure 3:
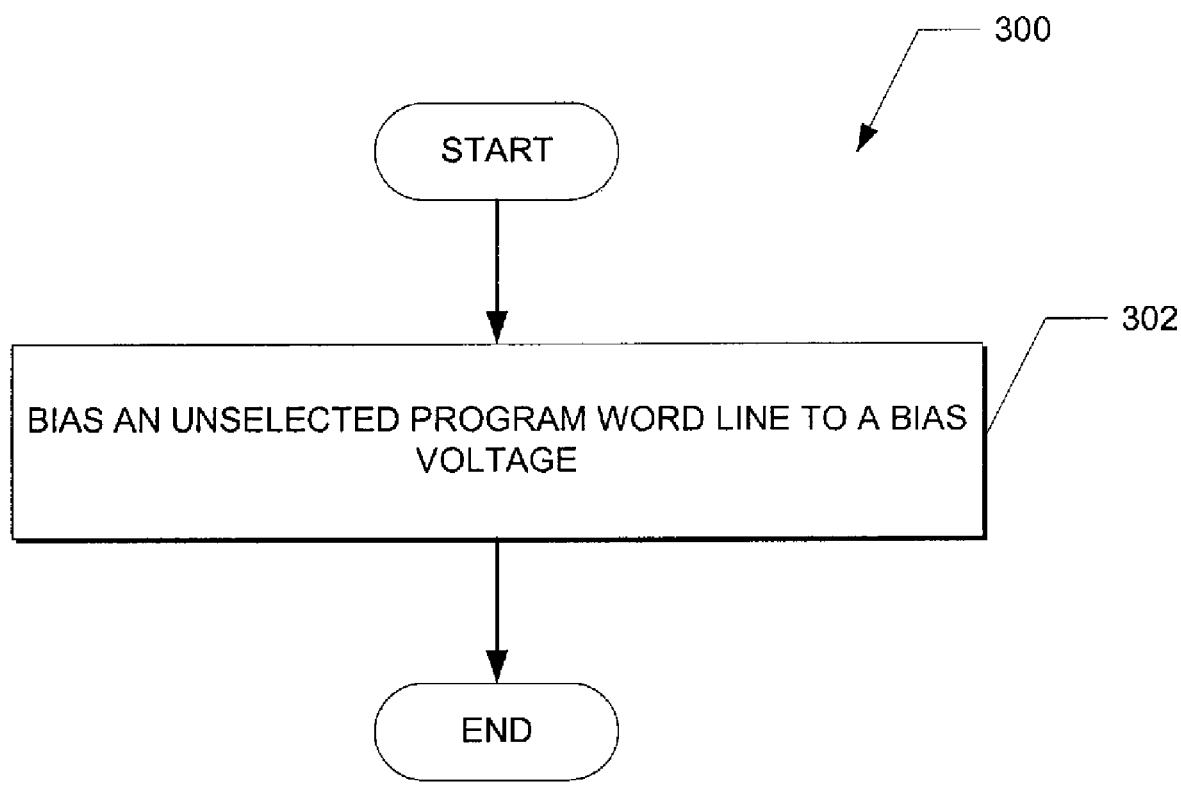
FIG. 3 is a flow diagram of a general overview of a method, in accordance with an example embodiment, for reducing bit line leakage current.

FIG. 3 is a flow diagram of a general overview of a method, in accordance with an example embodiment, for reducing bit line leakage current. In an example embodiment, method 300 may be implemented by the row decoder of FIG. 1, and may be located within logic circuit 102. As shown in FIG. 3, in an example embodiment, an unselected program word line is biased to a bias voltage at 302. As explained in more detail below, in an example embodiment, the unselected program word line is biased at all times. For example, the unselected program word line is biased in every operation (read operation, program operation, non-read modes, non-program modes, or other operations). In another example embodiment, the unselected word line is biased during read operations. In yet another example embodiment, the unselected program word line is biased during a discharge period of a selected bit line.

Figure 4:
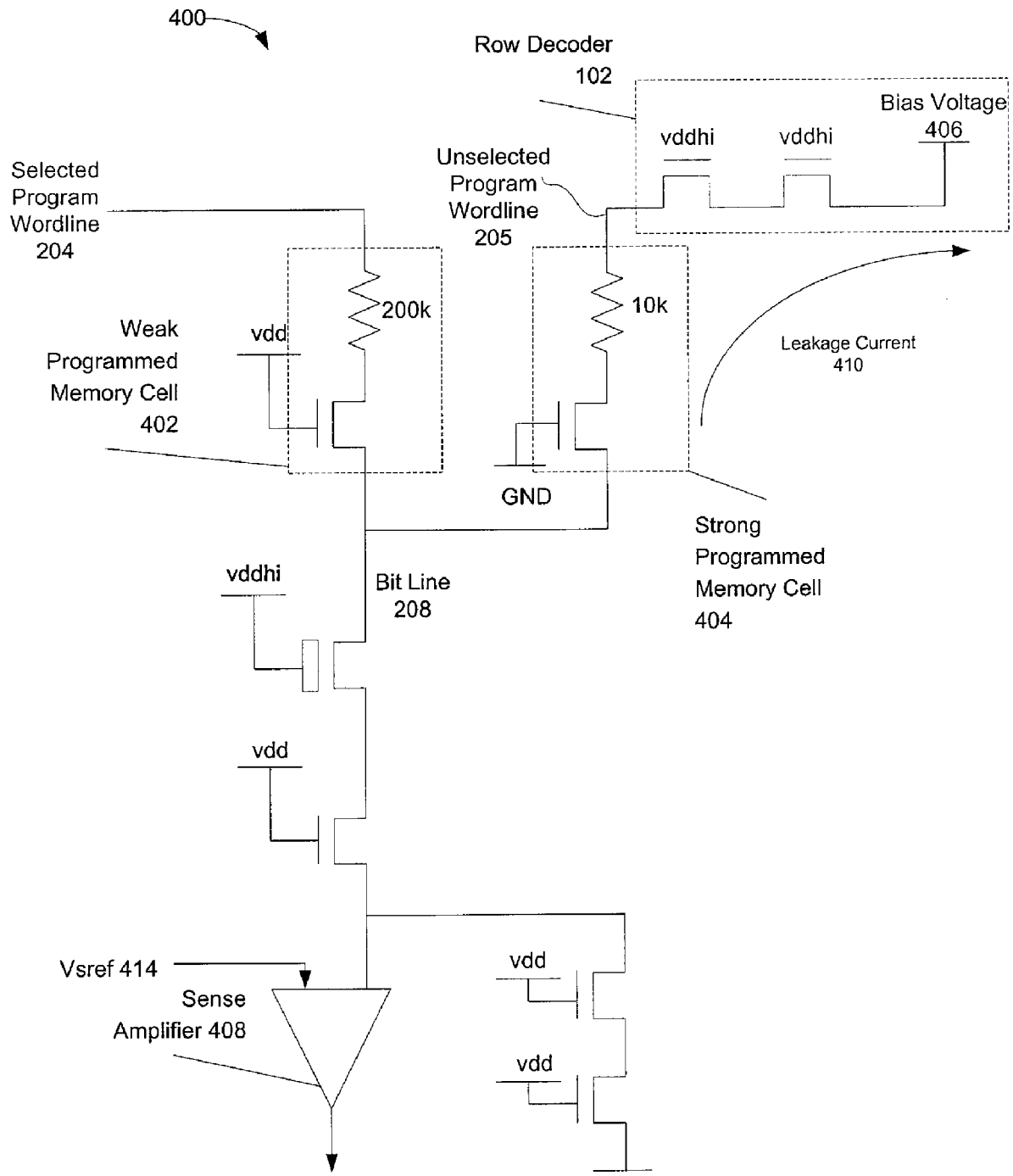
FIG. 4 is a schematic diagram, in accordance with an example embodiment, of a memory for reducing bit line leakage current.

FIG. 4 is a schematic diagram, in accordance with an example embodiment, of a memory for reducing bit line leakage current. Memory 400 includes two memory cells 402 and 404 connected to sense amplifier 408 by way of bit line 208. Memory 400 also includes row decoder 102 connected to memory cell 404 by unselected program word line 205. Each memory cell 402 or 404 includes two transistors. One transistor may store a bit and the other transistor is the selected transistor. When memory cell 402 is selected for a read operation, selected program word line 204 connected to memory cell 402 is at a regulated voltage and read word line is precharged to vdd. For unselected memory cell 404 in a read operation, both unselected program word line 205 and read word line are pulling to ground. Here, selected memory cell 402 is weakly programmed while unselected memory cell 404 is strongly programmed. In weakly programmed memory cell 402, the transistor that stores the bit has a high resistance (e.g., 200 k ohms). As a result, as shown in FIG. 4, such transistor acts like a resistor with high resistance. In strongly programmed memory cell 404, the transistor that stores the bit has low resistance (e.g., 10 k ohms). Such transistor therefore acts like a resistor with low resistance and can create a leakage path. As a result, in a read operation, current 410 from bit line 208 may leak through unselected memory cell 404 that is strongly programmed. Leakage current 410 may therefore slow down the rise of voltage of bit line 208, which feeds to sense amplifier 408.

To reduce leakage current 410, unselected program word line 205 connected to memory cell 404 may be biased to bias voltage 406. In the example embodiment of FIG. 4, row decoder 102 may include a voltage source (not shown) to bias unselected program word line 205 to bias voltage 406. In another example embodiment, the voltage source may be located outside of row decoder 102. It should be appreciated that, in general, a voltage source can be a variety of circuit elements that produce voltage. As explained in more detail below, bias voltage 406 may be based on reference voltage (vref) 414. It should be appreciated that reference voltage 414 is a fixed, direct current voltage that does not vary or change with temperature.

Figure 5A:
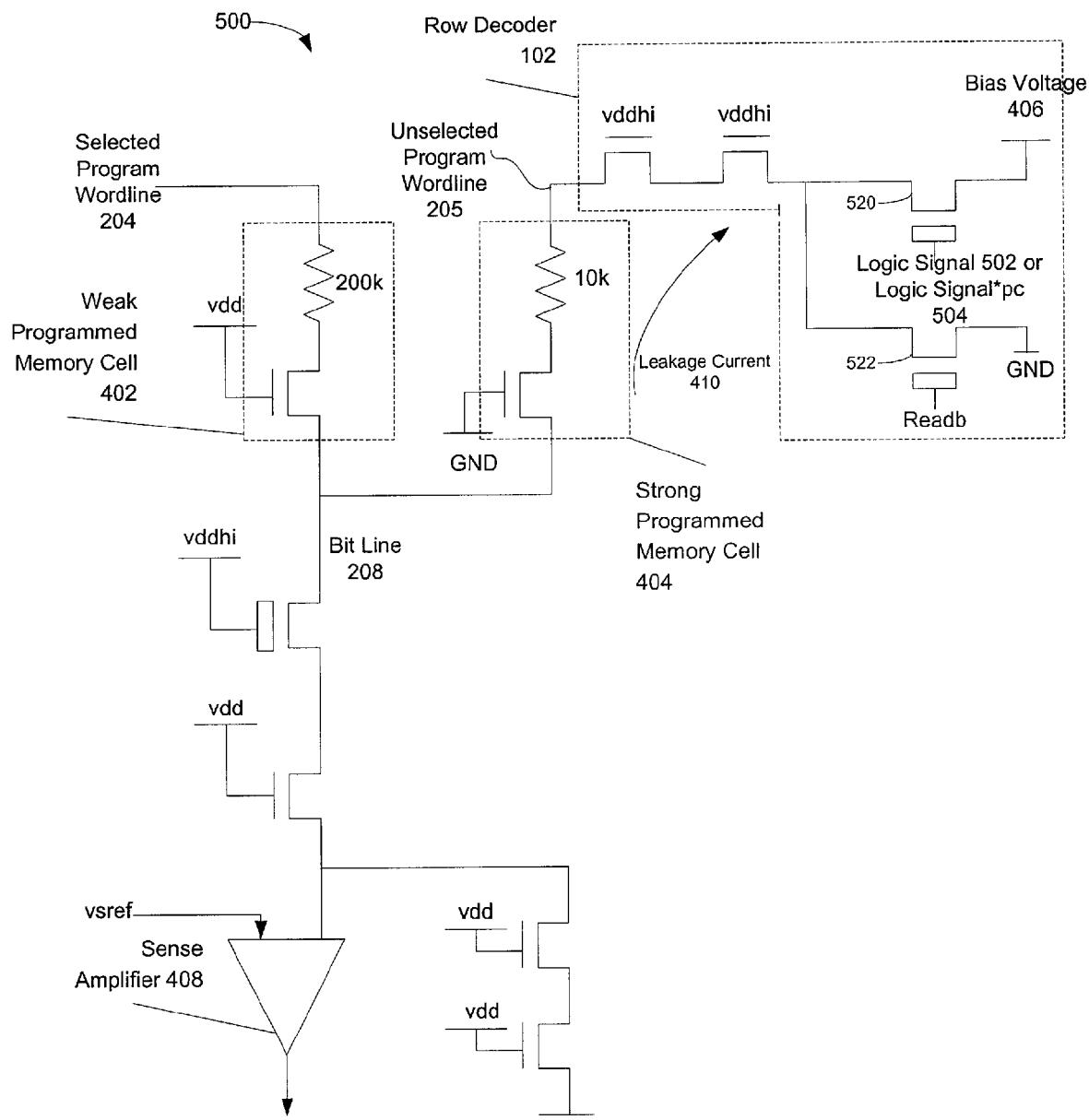
FIG. 5A is a schematic diagram, in accordance with another example embodiment, of a memory for reducing bit line leakage current.

FIG. 5A is a schematic diagram, in accordance with another example embodiment, of a memory for reducing bit line leakage current. Memory 500 includes two memory cells 402 and 404 connected to sense amplifier 408 by way of bit line 208. Memory 500 also includes row decoder 102 connected to memory cell 404 by unselected program word line 205. When memory cell 402 is selected for a read operation, selected program word line 204 is at a regulated voltage and read word line is precharged to vdd. For unselected memory cell 404 in a read operation, both unselected program word line 205 and read word line are pulling to ground. Since selected memory cell 402 is weakly programmed while unselected memory cell 404 is strongly programmed, current 410 from bit line 208 may leak through unselected memory cell 404 in a read operation.

Here, row decoder 102, in an example embodiment, may include one or more switches, such as switches 520 and 522, that are connected to a voltage source (not shown) and memory cell 404 by way of unselected program word line 205. Switches 520 and 522 are configured to connect or disconnect memory cell 404 to the voltage source that biases unselected program word line 205 to bias voltage 406. A transistor is an example of a switch.

Figure 5B:
FIG. 5B is a timing diagram of logic signal.

In an example embodiment, row decoder 102 may be configured to bias unselected program word line 205 during a read operation to reduce leakage current. Here, switches 520 and 522 are configured to connect memory cell 404 to the voltage source during a read operation. Logic signal 502 is applied to gate of switch 520 (or transistor) and the switch is switched according to the application of the logic signal level. FIG. 5B is a timing diagram of logic signal 502. At the beginning of a read operation, logic signal 502 transitions from low to high. As shown in FIG. 5A, switch 502 therefore connects the voltage source to memory cell 404, which results in bias of unselected program word line 205 to bias voltage 406. As shown in FIG. 5B, at the end of the read operation, logic signal 502 transitions from high to low. As a result, returning to FIG. 5A, switch 502 disconnects the voltage source to memory cell 404.

Figure 5C:
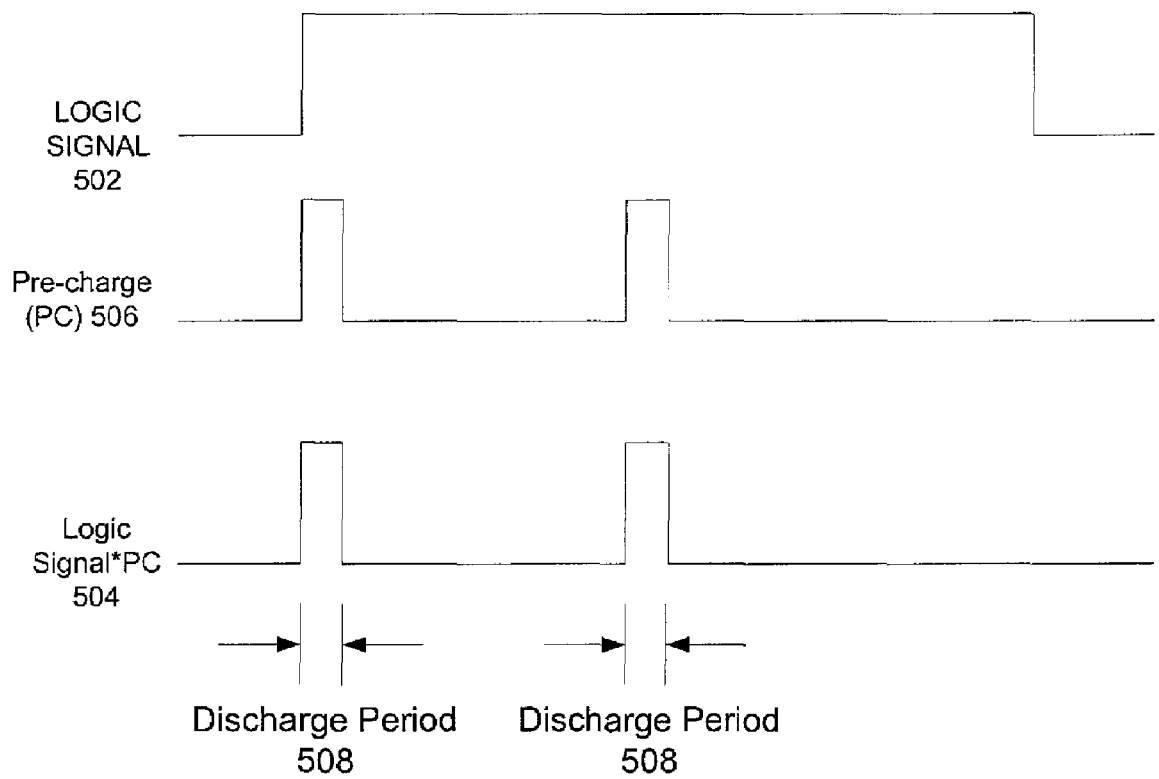
FIG. 5C is a timing diagram of logic signal*pc voltage.

In another example embodiment, row decoder 102 may be configured to bias unselected program word line 205 during a discharge period of selected bit line 208. Here, switches 520 and 522 are configured to connect memory cell 404 to the voltage source during a discharge period of bit line 208. Logic signal*pc voltage 504 is applied to gate of switch 520 (or transistor) and the switch is switched according to the application of the logic signal*pc voltage. FIG. 5C is a timing diagram of logic signal*pc voltage 504. As shown in FIG. 5C, logic signal 502 is high during a read operation. The selected bit line is precharged to voltage 506, such as a voltage near ground (e.g., 100 mV to 300 mV), according to the timing diagram. Timing diagram for logic signal*pc voltage 504 is an overlay of logic signal 502 and precharge voltage 506. Discharge period 508 therefore is the interval of time between the transition of low to high and the transition from high to low, as shown in logic signal*pc voltage 504 timing diagram. After discharge period 508, the unselected program word line may be floated.

Figure 6:
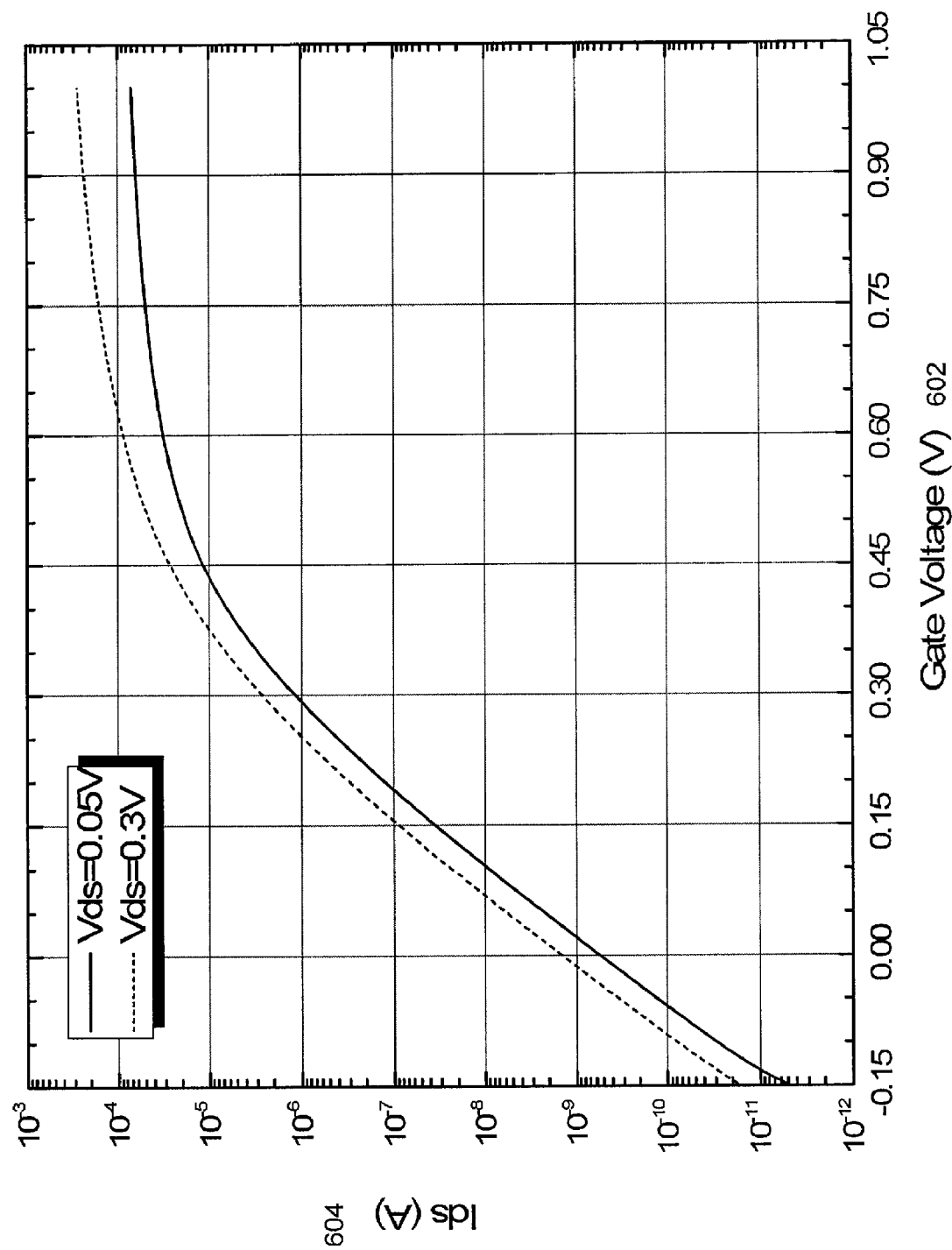
FIG. 6 is a graph diagram, in accordance with example embodiments, illustrating the transfer characteristics of an n-channel metal-oxide-semiconductor field-effect transistor (NMOS)

FIG. 6 is a graph diagram, in accordance with example embodiments, illustrating the transfer characteristics of an n-channel metal-oxide-semiconductor field-effect transistor (NMOS). It should be appreciated that the magnitude of current levels may depend on a variety of factors, such as thickness of the gate oxide and channel length of a transistor. Graph of FIG. 6 illustrates an NMOS transistor drain current 604 as a function of gate voltage (Vg) 602 and drain-to-source voltage differential (Vds). The magnitude of bias voltage may be based on the graph. As shown for Vg=0V, drain current 604 decreases almost 60% as the drain-to-source voltage differential (Vds) is reduced from 0.3V to 0.05V. Alternatively, drain current 604 can be reduced almost two orders of magnitude if the gate is biased at Vg=−0.15V. In an example embodiment, bias voltage (or Vg) may be less than a reference voltage (vref). In another example embodiment, the bias voltage is about equal to a reference voltage. For example, bias voltage applied to unselected program word line can be about 100 mV. As used herein, the term "about" means that the specified dimension or parameter may be varied within an acceptable tolerance for a given application. In some example embodiments, the acceptable tolerance is ±10%.

Figure 7:
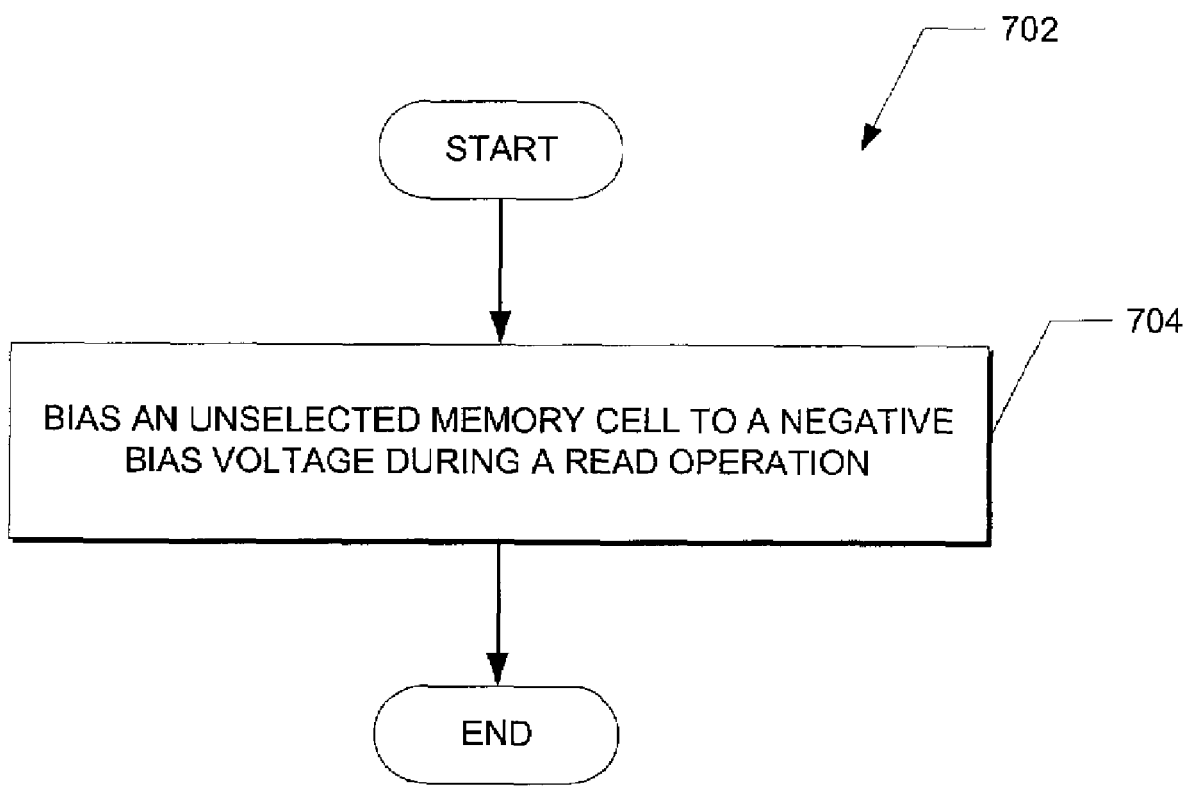
FIG. 7 is a flow diagram of a general overview of a method, in accordance with another example embodiment, for reducing bit line leakage current.

FIG. 7 is a flow diagram of a general overview of a method, in accordance with another example embodiment, for reducing bit line leakage current. As shown in FIG. 7, in an example embodiment, unselected read word lines are biased to a negative bias voltage at 704 during a read operation. As explained in more detail below, a negative voltage source may be connected to a memory cell and, to reduce leakage current of the selected bit line, the negative voltage source biases the unselected memory cell to a negative bias voltage when the memory cell is unselected.

Figure 8:
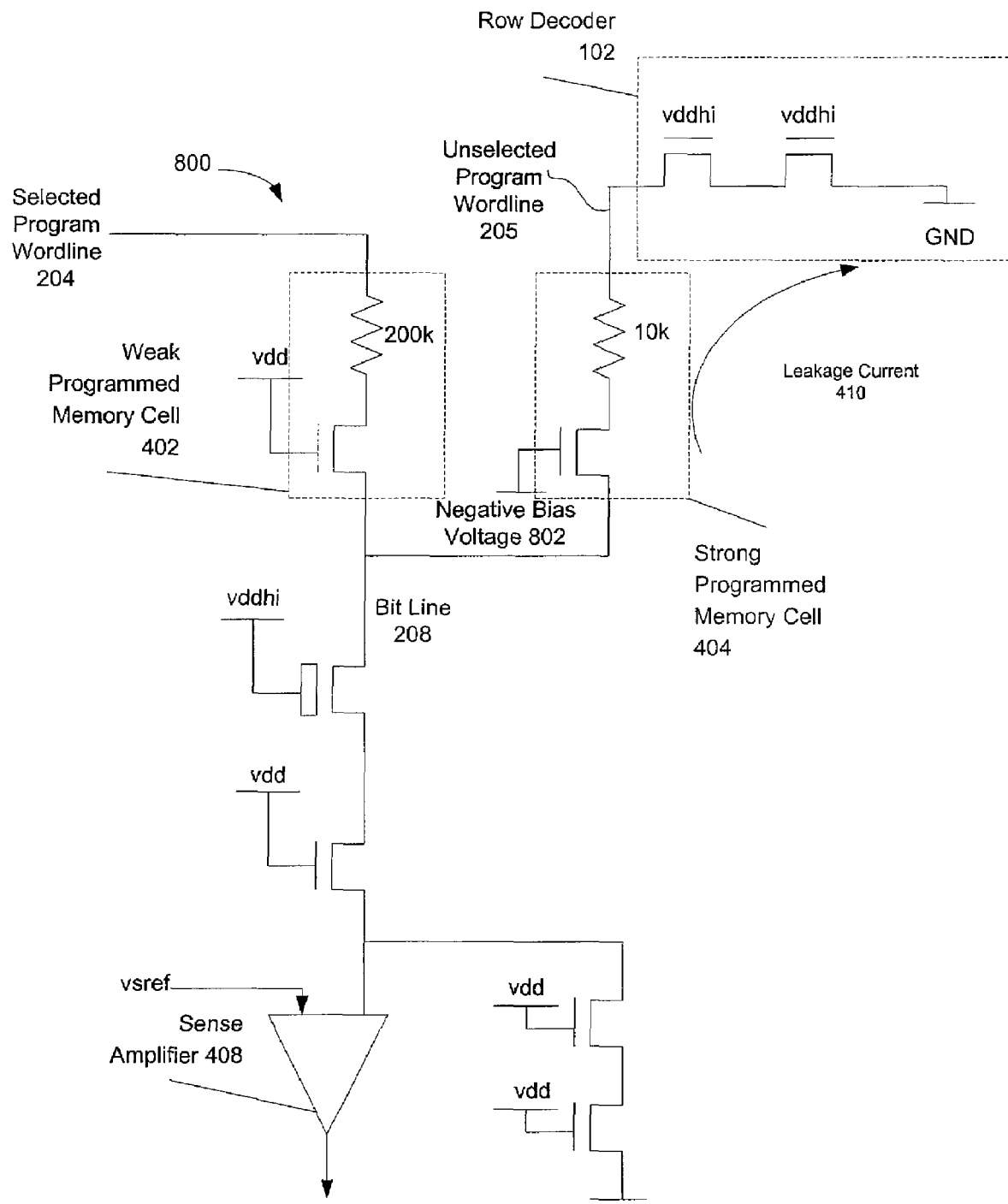
FIG. 8 is a schematic diagram, in accordance with yet another example embodiment, of a memory for reducing bit line leakage current.

FIG. 8 is a schematic diagram, in accordance with yet another example embodiment, of a memory for reducing bit line leakage current. Memory 800 includes two memory cells 402 and 404 connected to sense amplifier 408 by way of bit line 208. Memory 800 also includes row decoder 102 connected to memory cell 404 by unselected program word line 205. When memory cell 402 is selected for a read operation, selected program word line 204 is at a regulated voltage and read word line is precharged to vdd. For unselected memory cell 404 in a read operation, both unselected program word line 204 and read word line are pulling to ground. Here, selected memory cell 402 is weakly programmed while unselected memory cell 404 is strongly programmed. As a result, in a read operation, current 410 may leak through unselected memory cell 404 that is strongly programmed.

A voltage source (not shown) may be connected to memory cell 404. In the example embodiment shown in FIG. 8, the voltage source is connected to the gate of a transistor associated with memory cell 404. To reduce leakage current 410, the voltage source connected to memory cell 404 is configured to bias the memory cell to negative bias voltage 802 in a read operation when the memory cell is unselected. A switch (not shown) connected between the voltage source and memory cell 404 may be included to connect the voltage source to the memory cell during a read operation when the memory cell is unselected. The switch may also be configured to disconnect the voltage source during non-read operations, such as program operations, erase operations, and other non-read operations.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method for reducing bit line leakage current, the method comprising:
    biasing an unselected program word line to a bias voltage, the unselected program word line being connected to a memory cell, the memory cell including a breakdown transistor connected in series to a select transistor, the select transistor being connected to a read word line and configured to select or unselect the memory cell, the breakdown transistor being connected to the unselected program word line and configured to form a conductive path based on an application of a programming pulse.

2. The method of claim 1, wherein the unselected program word line is biased during a read operation.

3. The method of claim 1, wherein the unselected program word line is biased during a discharge period of a selected bit line.

4. The method of claim 3, further comprising floating the unselected program word line after the discharge period.

5. The method of claim 1, wherein the bias voltage is less than a reference voltage.

6. The method of claim 1, wherein the bias voltage is about equal to a reference voltage.

7. A method for reducing bit line leakage current, the method comprising:
    biasing an unselected memory cell to a negative bias voltage during a read operation, the unselected memory cell including a breakdown transistor connected in series to a select transistor, the select transistor being connected to a read word line and configured to select or unselect the memory cell, the breakdown transistor being connected to a program word line and configured to form a conductive path based on an application of a programming pulse by way of the program word line.

8. A memory, comprising:
    a memory cell including a breakdown transistor connected in series to a select transistor, the select transistor being connected to a read word line and configured to select or unselect the memory cell, the breakdown transistor being connected to a program word line and configured to form a conducting path based on an application of a programming pulse by way of the program word line; and
    a word line decoder connected to the memory cell by the program word line, the word line decoder being configured to bias the program word line to a bias voltage when the program word line is unselected.

9. The memory of claim 8, wherein the word line decoder is configured to bias the program word line during a read operation.

10. The memory of claim 8, wherein the memory further comprises a column decoder connected to the memory cell by a bit line.

11. The memory of claim 10, wherein the word line decoder is configured to bias the program word line during a discharge period of the bit line when the bit line is selected.

12. The memory of claim 8, wherein the program word line is biased to the bias voltage during one or more of a read operation or a program operation.

13. The memory of claim 8, wherein the word line decoder is further connected to the memory cell by a read word line and a write word line.

14. The memory of claim 8, wherein the bias voltage is less than a reference voltage.

15. The memory of claim 8, wherein the bias voltage is about equal to a reference voltage.

16. A memory, comprising:
- a memory cell including a breakdown transistor connected in series to a select transistor, the select transistor being connected to a read word line and configured to select or unselect the memory cell, the breakdown transistor being connected to a program word line and configured to form a conducting path based on an application of a programming pulse by way of the program word line;
- a voltage source connected to the memory cell, the voltage source being configured to bias the memory cell to a negative bias voltage; and
- a switch connected to the memory cell and the voltage source, the switch being configured to connect the voltage source to the memory cell during a read operation and when the memory cell is unselected.

17. A non-volatile memory, comprising:
- a memory cell including a breakdown transistor connected in series to a select transistor, the select transistor being connected to a read word line and configured to select or unselect the memory cell, the breakdown transistor being connected to a program word line and configured to form a conducting path based on an application of a programming pulse by way of the program word line; and
- a voltage source connected to the memory cell by the program word line, the voltage source being configured to bias the program word line to a bias voltage when the program word line is unselected.

18. The non-volatile memory of claim 17, further comprising a switch connected to the memory cell and the voltage source by the program word line, the switch being configured to connect the memory cell to the voltage source during a read operation.

19. The non-volatile memory of claim 17, further comprising a switch connected to the memory cell and the voltage source by the program word line, the switch being configured to connect the memory cell to the voltage source during a discharge period of a selected bit line.

20. The non-volatile memory of claim 17, wherein the bias voltage is about 100 mV.

* * * * *